United States Patent
Osternack et al.

(10) Patent No.: US 8,369,069 B2
(45) Date of Patent: Feb. 5, 2013

(54) AVIONICS EQUIPMENT CARRIER SYSTEM WITH QUICK-MOUNT HOUSING AND QUICK-MOUNT MODULES

(75) Inventors: Stefan Osternack, Hamburg (DE); Oliver Schalke, Hamburg (DE); Sven Rehmeier, Mölln (DE); Jörg Bradtke, Hamburg (DE)

(73) Assignee: Airbus Operations GmbH (DE)

( * ) Notice: Subject to any disclaimer, the term of this patent is extended or adjusted under 35 U.S.C. 154(b) by 874 days.

(21) Appl. No.: 11/992,148

(22) PCT Filed: Sep. 19, 2006

(86) PCT No.: PCT/EP2006/009094
§ 371 (c)(1),
(2), (4) Date: Jul. 8, 2009

(87) PCT Pub. No.: WO2007/039096
PCT Pub. Date: Apr. 12, 2007

(65) Prior Publication Data
US 2010/0008053 A1    Jan. 14, 2010

Related U.S. Application Data

(60) Provisional application No. 60/718,672, filed on Sep. 20, 2005.

(30) Foreign Application Priority Data

Sep. 19, 2005    (DE) .......................... 10 2005 044 712

(51) Int. Cl.
*H05K 5/00* (2006.01)
*H05K 7/00* (2006.01)
*B64D 45/00* (2006.01)
*B64D 47/00* (2006.01)
*B64F 1/00* (2006.01)
*B64C 1/00* (2006.01)

(52) U.S. Cl. .................. 361/679.01; 244/1 R; 244/129.1
(58) Field of Classification Search ............. 361/679.01; 244/1 R, 129.1, 136
See application file for complete search history.

(56) References Cited

U.S. PATENT DOCUMENTS 5,234,348 A    8/1993    Konsevich et al.
(Continued)

FOREIGN PATENT DOCUMENTS

| | | |
|---|---|---|
| DE | 69710619 T2 | 9/1997 |
| DE | 29721136 U1 | 12/1997 |

(Continued)

OTHER PUBLICATIONS

Peterson, Wade, "VME64X—a VME64 Extension Standard", 2000.
(Continued)

*Primary Examiner* — Anthony Haughton
(74) *Attorney, Agent, or Firm* — Lerner, David, Littenberg, Krumholz & Mentlik, LLP

(57) ABSTRACT

An avionics equipment carrier system for slide-in modules with data processing, data transmitting, data storage or data displaying devices, such as for example electronics printed circuit boards, network components, storage devices, display devices and the like, or power supply devices, includes a housing, at least one module rack for accommodating the slide-in modules and at least one backplane board with Ethernet connection architecture. When the dimensions of the housing comply with ARINC standards, and the housing is arranged for installation in an avionics module rack as a quick-mount housing, and any desired circuit boards of a specific standard format can be used in the slide-in modules which are designed as quick-mount modules.

12 Claims, 5 Drawing Sheets

U.S. PATENT DOCUMENTS

| | | | |
|---|---|---|---|
| 5,889,775 A * | 3/1999 | Sawicz et al. | 370/360 |
| 6,058,288 A * | 5/2000 | Reed et al. | 455/3.06 |
| 6,133,846 A | 10/2000 | Birkedahl et al. | |
| 6,394,815 B1 | 5/2002 | Sarno et al. | |
| 6,662,255 B1 | 12/2003 | Klein | |
| 6,801,769 B1 * | 10/2004 | Royalty | 455/431 |
| 2002/0012236 A1 | 1/2002 | Dimarco | |
| 2002/0093788 A1 | 7/2002 | Rothschild | |
| 2003/0033464 A1 | 2/2003 | Larson et al. | |

FOREIGN PATENT DOCUMENTS

| | | |
|---|---|---|
| DE | 19703978 A1 | 8/1998 |
| DE | 19832058 A1 | 1/2000 |
| EP | 0269479 A1 | 6/1988 |
| EP | 1011300 A2 | 6/2000 |
| JP | 07-010675 | 1/1995 |
| JP | 2001203729 A | 7/2001 |
| JP | 2003150409 A | 5/2003 |
| JP | 2003157126 A | 5/2003 |
| JP | 2003216277 A | 7/2003 |
| JP | 2004327588 A | 11/2004 |
| JP | 2005524884 A | 8/2005 |
| RU | 43428 | 1/2005 |
| WO | 03014893 A2 | 2/2003 |
| WO | 03061222 A1 | 7/2003 |
| WO | 2007/039097 A1 | 4/2007 |

OTHER PUBLICATIONS

Babanov, Igor, "Compact PCI: The Future of Industrial Computers", Dec. 8, 1997.

Berdichevsky, Mikhail, "Eurocard Design in Built-In Systems", Apr. 2002.

* cited by examiner

AVIONICS EQUIPMENT CARRIER SYSTEM WITH QUICK-MOUNT HOUSING AND QUICK-MOUNT MODULES

REFERENCE TO RELATED APPLICATIONS

This application claims the benefit of the filing date of German Patent Application No. 10 2005 044 712.0 filed on Sep. 19, 2005 and of U.S. Provisional Patent Application No. 60/718,672 filed Sep. 20, 2005, the disclosure of which applications is hereby incorporated herein by reference.

FIELD OF THE INVENTION

The present invention relates to an avionics equipment carrier system for slide-in modules with data processing, data transmitting, data storage or data displaying devices, such as for example electronics printed circuit boards, network components, storage devices, display devices and the like, or power supply devices, comprising a housing, at least one module rack for accommodating the slide-in modules and at least one backplane board with Ethernet connection architecture.

TECHNOLOGICAL BACKGROUND

Avionics devices in aircraft are generally integrated in an avionics rack located in the cockpit or in close proximity to the cockpit. Normally the individual equipment compartments in the avionics rack have dimensions that meet a common standard, such as, for example, specified in ARINC 600. This makes it possible to accommodate components with standardised dimensions and apart from original equipment also facilitates the integration of new devices in the case of subsequent retrofit of an aircraft at a later point in time. Devices with standardised dimensions can be provided by a relatively broad manufacturer spectrum and are economical when compared to devices made to specifications.

Avionics equipment in turn often comprises several components which when acting together result in a desired system. Such components can, for example, include servers, gateways, interfaces and power supply devices which together are installed in a common equipment carrier, which in turn is integrated in the avionics rack. At present, equipment carriers exist which make it possible to quickly exchange individual components in the case of a defect or in the case of a desired retrofit (due to this ability also referred to as line replaceable units, LRUs), but which as an entity do not offer this ability. Thus, the Rockwell Collins ISC-2100 (information services cabinet, see also http://www.rockwellcollins.com/products/cs/at/page982.html) is not designed as an LRU, i.e. it cannot quickly be deinstalled from an avionics rack; instead, deinstallation requires a degree of effort and above all a considerable amount of time. By way of its front the ISC-2100 can, however, relatively easily be equipped with various components. However, the dimensions of the surrounding housing of the ISC-2100 do not comply with any ARINC standards, so that particularly for the ISC-2100 a specially designed accommodation rack in the aircraft becomes necessary, in which rack the housing can be firmly installed. The "Airbus Flight Information Service" devices (AFIS), made by Rockwell, which devices have dimensions that conform to ARINC, comprise an LRU surrounding housing but no components designed as LRUs. Quick exchange of the individual components of an AFIS is thus not possible. The network server system SAGEM A380 NSS (see also http://www.sagem-ds.com/eng/bds_navio_200.htm) while comprising an LRU housing, which does not however conform to ARINC, does not make it possible either to quickly exchange integratable components; such exchange requires dismantling of the entire device.

The lack of the ability to quickly exchange individual components is disadvantageous as far as cost-effective inventory keeping of entire systems and in some respects more difficult maintenance are concerned. Moreover, if it is not possible to quickly exchange the entire avionics device in the form of an equipment carrier comprising equipment, subsequent retrofit or exchange of defective devices of the avionics of an aircraft is made difficult in a disadvantageous manner.

Normal avionics devices are associated with a further disadvantage due to the widespread use of components whose dimensions do not conform to any common standard, for example the use of electronics printed circuit boards and the like that have been made to specifications. In addition, it is disadvantageous to use electronics printed circuit boards which, while comprising standardised dimensions, use dimensions that are, however, disadvantageous. For example, with the use of 6U-CompactPCI printed circuit boards, cost savings can be achieved in the selection of a printed circuit board; however, as a result of the design height of the printed circuit boards the avionics devices into which they are integrated often comprise dimensions that do not conform to ARINC.

SUMMARY OF THE INVENTION

It is an object of the invention to overcome at least one of the above-mentioned disadvantages in order to improve the ease of service by quick interchangeability of components and of the entire avionics device, and to make it possible to integrate new functionalities without any structural changes to the avionics rack as a result of the ability to use modules with standard dimensions while at the same time saving space so that a commonly used avionics rack can be utilised to accommodate an equipped avionics equipment carrier.

This object may be met by an exemplary embodiment of the present invention in that the housing comprises dimensions that conform to ARINC, and is designed for installation in an avionics rack as a quick-mount housing, and in that any desired printed circuit boards of a specific standard format can be used in the slide-in modules, whose housings are designed as quick-mount housings.

It may be particularly advantageous if the slide-in modules are accommodated in a surrounding housing. In this way, said slide-in modules become easier to hold and are less likely to be damaged during quick installation or deinstallation.

Furthermore, it is preferred, when using standardised electronics printed circuit boards within the slide-in modules, if their non-standardised terminal assignment is converted to a desired terminal assignment of the slide-in module by means of adapter printed circuit boards.

Expediently, slide-in modules in an avionics equipment carrier system can be exchanged during ongoing operation. There is thus no need to engage in the process of switching the remaining slide-on modules off and on.

A separate module rack for the use of hard discs within the avionics equipment carrier system is particularly advantageous. Furthermore, to be gentle on the hard discs, this separate module rack can be suspended, so as to reduce vibrations, in the housing of the avionics equipment carrier system.

Furthermore, it is preferable to integrate a display device to display status data in the avionics equipment carrier system. For example, this makes it possible to easily detect any faults in the power supply.

Furthermore, it is advantageous if the display device comprises operating buttons to control basic functions of the avionics equipment carrier system, such as for example for switching the system on or off.

In order to combine several equipment groups, which are accommodated in different avionics equipment carrier system housings, they can advantageously be cascaded. In this way interactivity between slide-in modules from one of the housings and slide-in modules from another housing becomes possible.

BRIEF DESCRIPTION OF THE DRAWINGS

In the following, exemplary embodiments are described with reference to the following drawings.

DETAILED DESCRIPTION OF EXEMPLARY EMBODIMENTS

Figure 1:
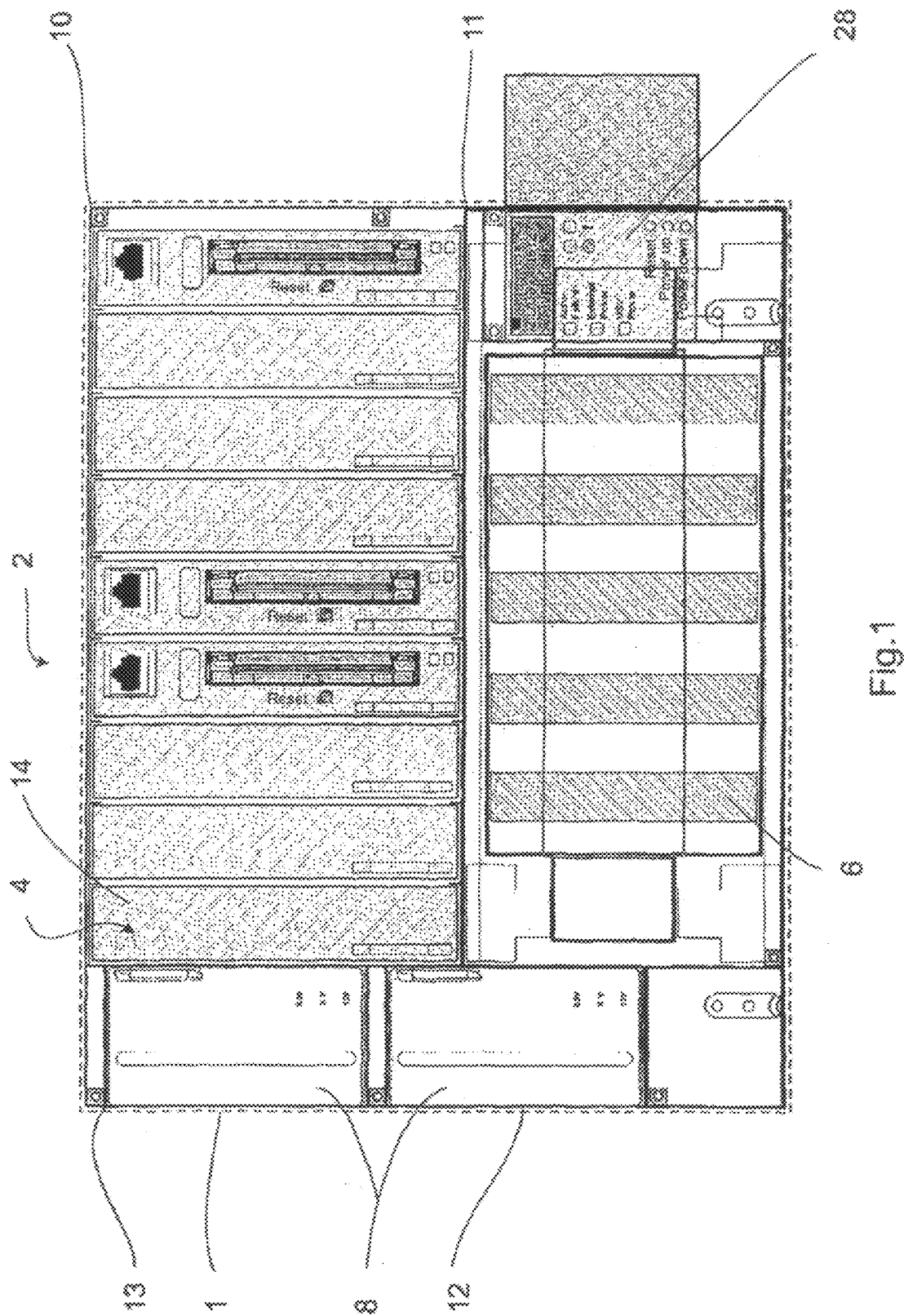
FIG. 1 shows a front view of an equipped avionics equipment carrier system.

FIG. 1 shows the front view of an equipped avionics equipment carrier system 2, inserted in an avionics rack 1, with slide-in modules 4, 6 and 8 that are inserted in racks 10, 11 and 13 located in the housing 12. The rack 10 is located above the rack 11 and accommodates the slide-in modules 4. In the lower rack 11 the slide-in modules 6 are arranged. In a further rack 13, which is adjacent to the left-hand side of the previously mentioned modules, two slide-in modules 8 are arranged, one on top of the other.

In order to facilitate the retrofitting of additional devices or the modernisation of a module rack (hereinafter referred to as an avionics rack), the housing 12 of the avionics equipment carrier system 2 according to the invention comprises dimensions that comply with a common standard in relation to widely used avionics racks, such as, for example, the ARINC 600 standard. Accordingly it is possible to insert the housing 12 in a free region of an avionics rack where it is locked into place or attached using suitable means, as a result of which in the case of correspondingly readily accessible installation, quick exchange of an avionics device to be replaced becomes possible. With the consistent use of avionics equipment carrier systems according to the invention the avionics rack can be designed throughout to conform to a single standard, and in future new functionalities can be retrofitted to said avionics rack without expensive modifications. Due to this ability, the avionics equipment formed by an equipped avionics equipment carrier system according to the invention can be designated a line replaceable unit (LRU).

In addition to this, as described above, the avionics equipment carrier system 2 itself can be equipped with additional or replacement slide-in modules in order to provide new functionalities within an avionics device comprising several slide-in modules 4, 6 and 8. Each of the devices within the slide-in modules 4, 6 and 8 comprises a housing that can be slid into the racks 10, 11 and 13. Consequently the devices are encapsulated in order to protect the equipment components, some of which, for example the electronics printed circuit boards, are sensitive, thus considerably facilitating the exchange of defective slide-in modules 4, 6 and 8. Due to the respective housing, the slide-in modules 4, 6 and 8 can be touched and held without requiring any particular care, and with suitable locking or attachment elements can be equipped in such a way that consequently they can easily be removed from the respective rack, or that by insertion and subsequent securing they can be integrated in the rack. The slide-in modules are preferably attached without the use of tools, such as, for example, by using snap-in or tension means or by using lock-down levers and the like. In order to integrate the slide-in modules 4, 6 and 8 the associated racks 10, 11 and 13 at least in part comprise slide faces, on which the slide-in modules 4, 6 and 8 are guided to their predetermined end positions. The slide-in modules 4, 6 and 8 are thus quickly exchangeable and are also LRUs. According to the above abbreviation the concept according to the invention can thus be designated an "LRU in LRU".

The slide-in modules 4 of the equipment carrier shown, wherein the designation "equipment carrier" refers to a combination of the housing 12 and the racks 10, 11 and 13, are predominantly data processing and data transmitting devices, in particular devices for wireless data transmission (in particular WLAN and GSM), servers, routers, switches, firewalls and devices for communication control. Tasks such as video streaming for in-flight entertainment systems, the provision of various communication services and a host of other requirements can be carried out in this way. As is described below, the slide-in modules 4 essentially comprise electronics printed circuit boards encapsulated by surrounding housings 14. As some of the front panels of the slide-in modules 4 show, slide-in slots for solid-state storage devices such as, for example, compact flash cards and network connections or USB connections for maintenance purposes are possible. Mechanically insensitive solid-state storage devices can, among other uses, be used to equip the slide-in module with program data or operating system data.

In the diagram shown in FIG. 1, the slide-in modules 6 comprise data-storing devices; in the embodiment shown these are mechanical hard discs encased by a housing. However, the data on these devices should not be used for data that is critical to security or to the operations, because, due to the occurring vibrations or impact loads in flight, no guarantee can be provided as far as the functionality of the hard discs is concerned. However, in order to reduce this problem, preferably the lower part of the rack 10 is suspended in the housing 12 so as to reduce vibrations. For example, the hard discs can be used for media data relating to an in-flight entertainment system. However, at the time of the present application it is foreseeable that in the near future the use of mechanical hard discs will be able to be replaced by other means that are less susceptible to mechanical loads. Preferably, the data-storing slide-in modules 6 are connected to the slide-in modules 4, by way of a stand-alone backplane PCB, which is attached in the lower part of the rack 10, with interfaces arranged thereon, and are supplied with the necessary operating voltages.

The slide-in modules 8, arranged one on top of the other, are used for supplying power to the devices installed in the rack 10. By using two power supply devices 8, the failure safety is improved.

The alignment, which in FIG. 1 is essentially horizontally spaced apart, in particular of the slide-in modules 4 and 6, is advantageous for their cooling. The avionics rack provides a certain quantity of a cooling air stream to each avionics device, which stream preferably enters through apertures on the underside of the avionics device and flows over the integrated components. The vertical alignment makes it possible for the air to evenly flow over all components, with the spacing between the components reducing the heat transfer of one component to the other by radiation and convection.

Furthermore, FIG. 1 shows a display module 28 which shows the status of the system and, for example, points out any errors. The display module further comprises operating buttons by means of which the entire system can be switched on or off. The display module can, for example, be made to connect to the slide-in modules by way of the commonly used interfaces I²C, IPMI or IPMB.

The number of the components used, as shown in FIG. 1, is shown as an example only and will vary depending on requirements. In some cases it may be advantageous to generate redundancies for reasons of fail-safe operation.

Figure 2:
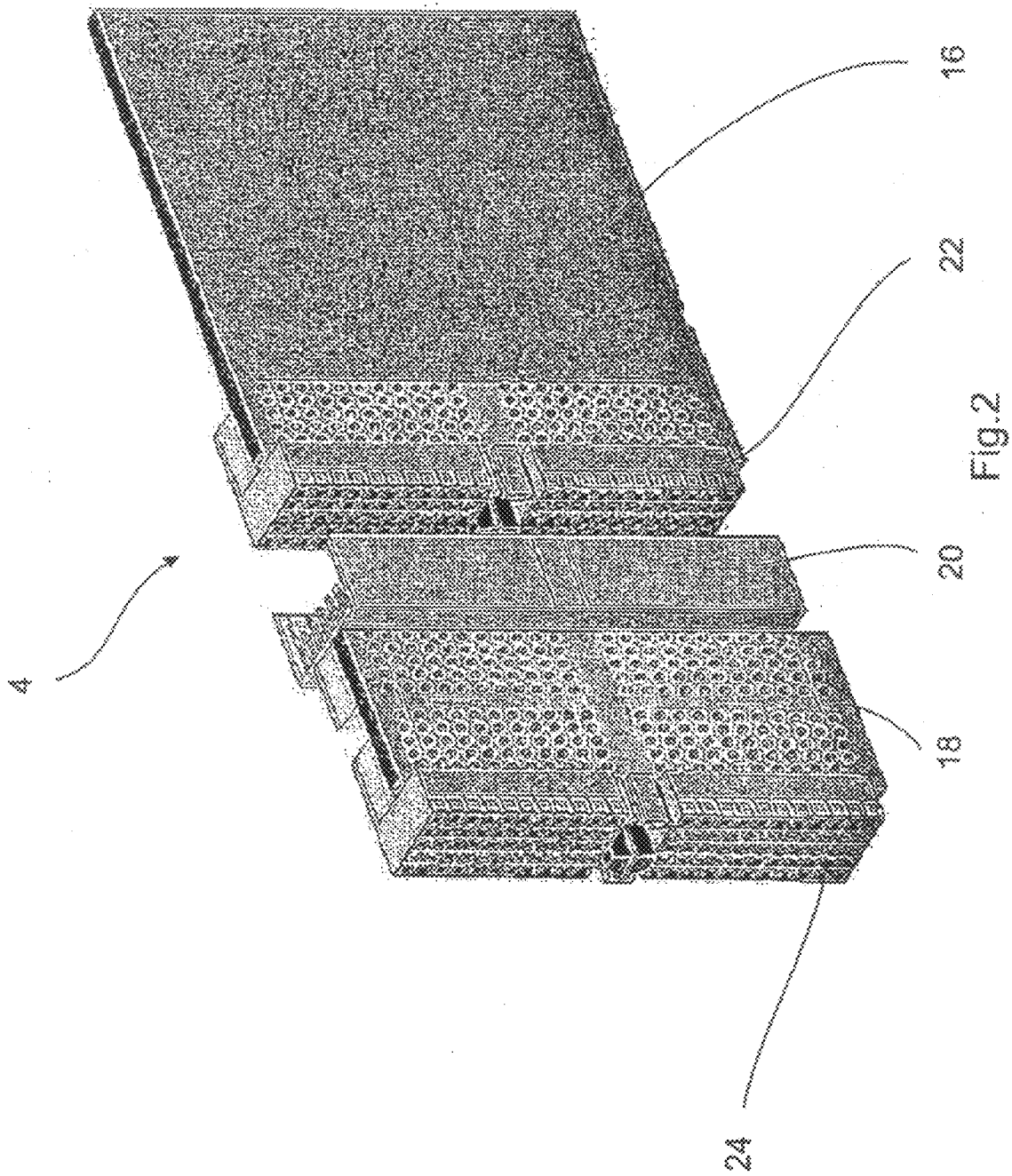
FIG. 2 shows a three-dimensional view of a slide-in module.

FIG. 2 in an exemplary manner shows the internal structure of a slide-in module 4. This structure is essentially identical in the case of most slide-in modules 4. In order to provide a desired functionality a corresponding electronics PCB 16 is integrated in the slide-in module 4. Advantageously the processor printed circuit board 16 is of a commonly used standard format, so that any electronics boards, from any manufacturer, which electronics boards comply with this standard, can be used in a slide-in module 4. By way of an example, the electronics printed circuit boards of the present invention comprise the 3U-CompactPCI format. When compared to electronics printed circuit boards used in commonly used avionics equipment, printed circuit boards using the 3U-CompactPCI format are smaller, with, for example, 6U-CompactPCI cards being twice as wide.

In order to lead out the various inputs and outputs, 3U-CompactPCI electronics printed circuit boards usually comprise a terminal strip with a number of pins. While the terminal strip of CompactPCI cards is standardised, this standardisation is however limited to the form of the terminal strip, to the spacing between the individual pins, and to the pin assignment within a particular region of the terminal strip. The pin assignment in a remaining region can be freely selected by the manufacturer of the electronics printed circuit board.

Identical terminal assignment of all slide-in modules is necessary; it results from the requirements of modularity and replaceability among each other. In order to ensure that always the same terminal assignment is used, adaptation of the terminal assignment of the CompactPCI card is necessary, depending on the model. This is implemented by an adapter printed circuit board 18, whose connector strip 20 can be connected to a socket strip 22 of the electronics printed circuit board 16. The adapter printed circuit board changes over the connection pins that have been freely selected by the manufacturer, and on the socket strip 24 of the adapter printed circuit board provides a terminal assignment that applies to all slide-in modules. By means of this method, any desired electronics printed circuit board 16 can be adapted to be used within the slide-in module 4.

Figure 3:
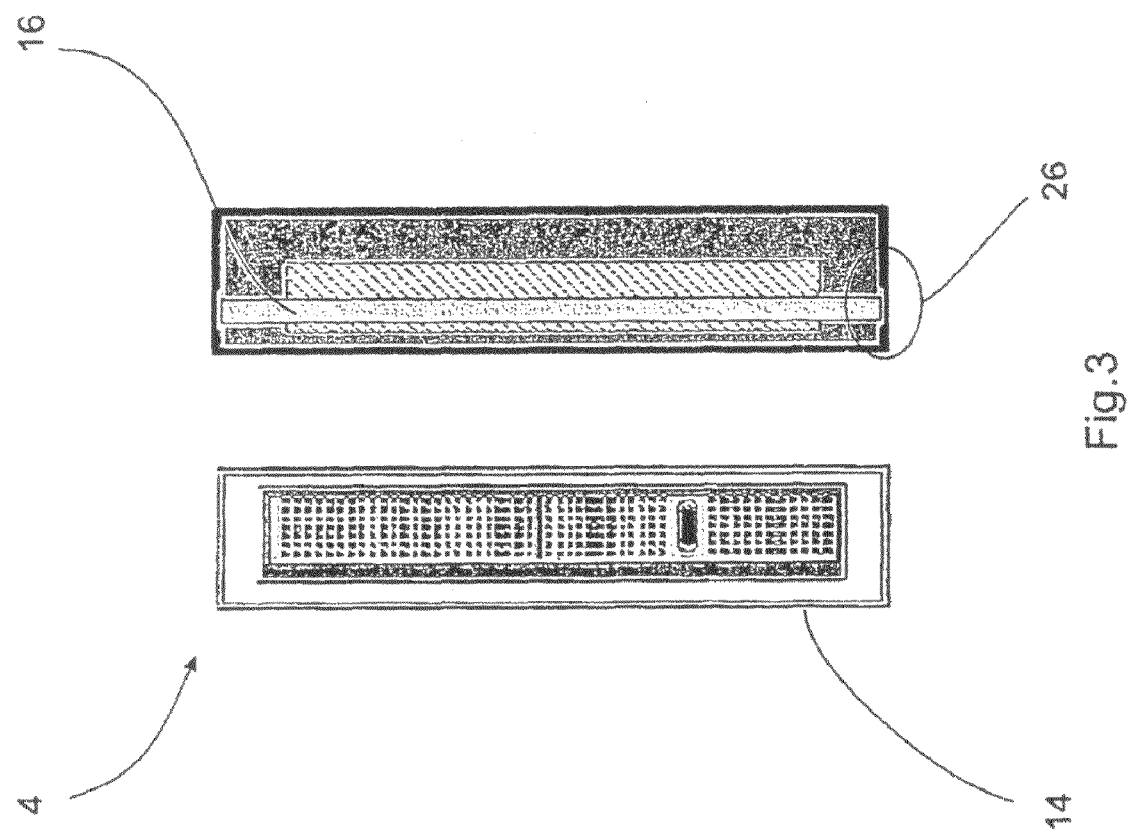
FIG. 3 shows a rear view and a section of a slide-in module 4 with inserted electronics printed circuit board.

FIG. 3 shows a rear view and a section view of a slide-in module 4 with printed circuit boards inserted in the housing. The socket strip 24 of the slide-in module closes off with the surrounding housing 14 at the rear of the slide-in module 4, wherein the rear is the end of the slide-in module 4, which end is inserted in the rack 110. The electronics printed circuit board 16 and the adapter printed circuit board 18 (not visible in FIG. 3) are held in printed circuit board guides 26, which not only serve to hold the printed circuit boards but also to align the terminal strips.

Figure 4:
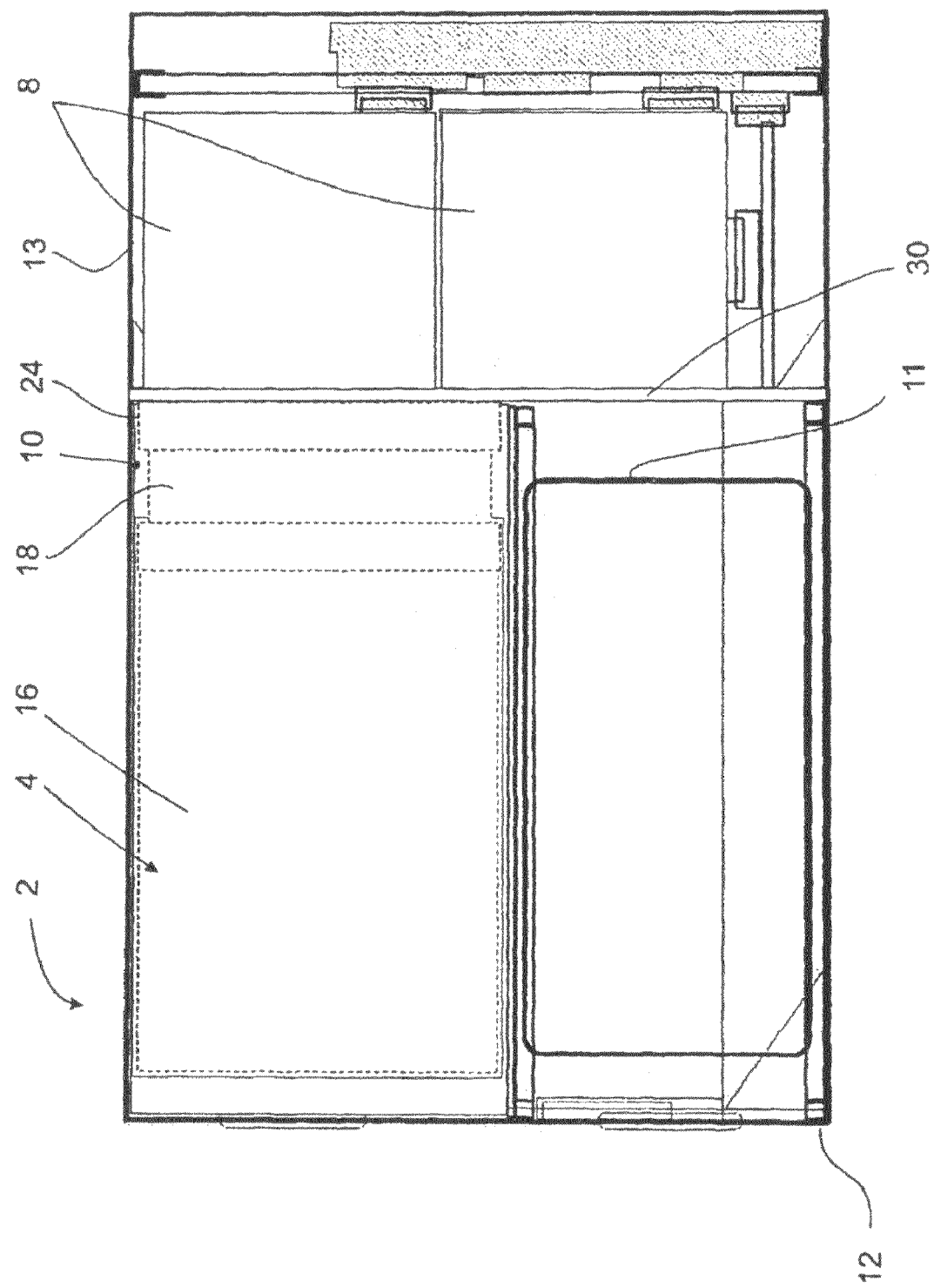
FIG. 4 shows a lateral section of an equipped avionics equipment carrier system.

FIG. 4 shows a lateral section of an avionics equipment carrier system 2, equipped for an avionics device, comprising slide-in modules 4, 6 and 8. In the rack 10, a slide-in module 4 is shown, which is equipped with an electronics printed circuit board 16 and an adapter printed circuit board 18. On the underside of the rack 10, the rack 11, which is used for accommodating hard discs 6, adjoins, suspended in the housing 12 so as to reduce vibrations.

At the rear of the slide-in modules 4 the backplane PCB 30 adjoins, which for each slide-in module 4 to be connected comprises a connector strip 32 (not shown in FIG. 4) into which the socket strip 24 of the socket strip that finishes off the slide-in module 4 snaps.

Figure 5:
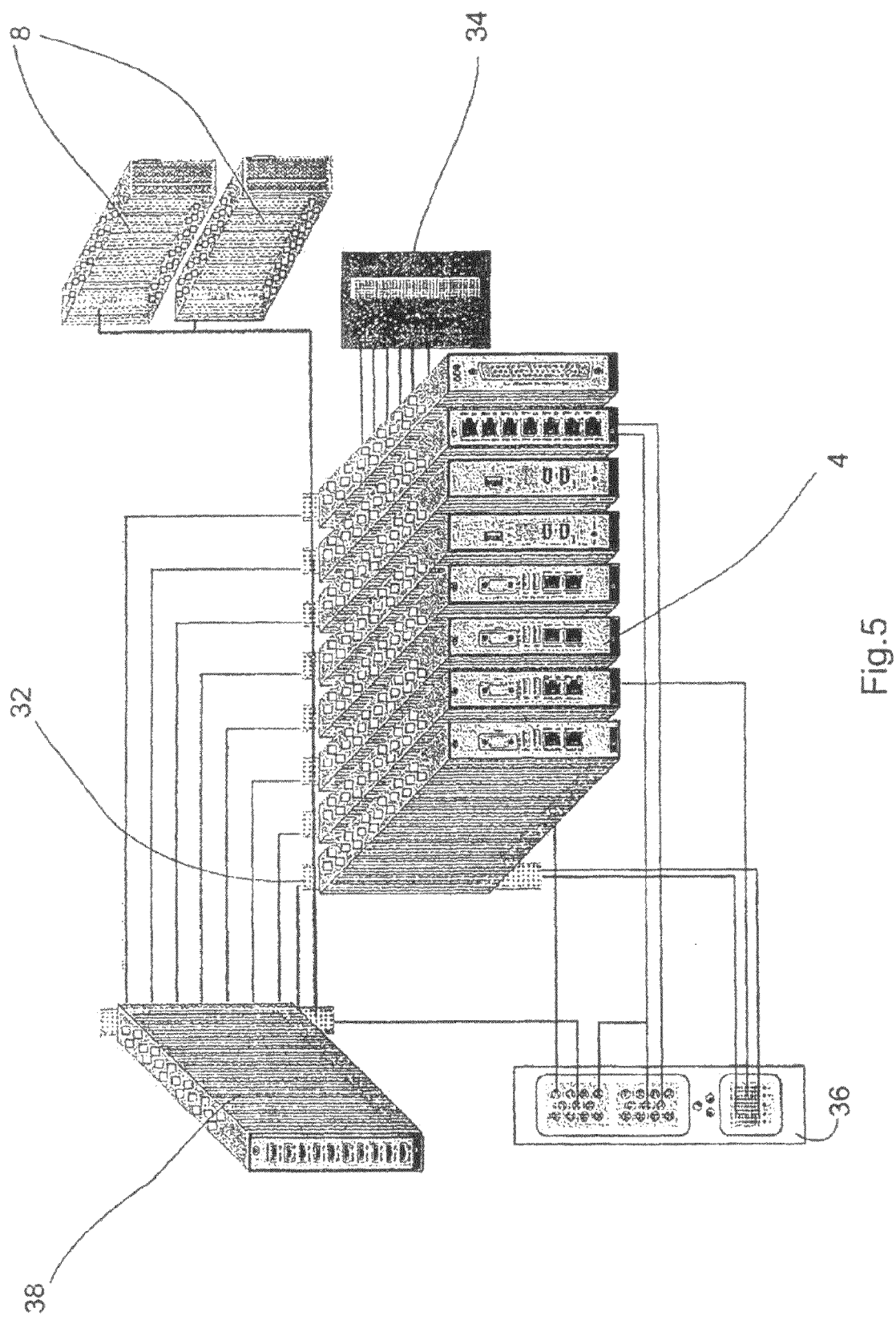
FIG. 5 shows a diagrammatic view of the backplane connection architecture.

In order to provide the functionalities of the slide-in modules located in the rack 10, apart from the actual devices in the slide-in modules a particular connection architecture is also required, by means of which, independently of any given purpose of application of the slide-in module, interaction between the slide-in module and the avionics equipment carrier system is made possible. FIG. 5 diagrammatically shows such a connection architecture.

Preferably, the connections between the slide-in modules 4 are implemented by a shared backplane PCB 30 within the avionics equipment carrier system, which backplane PCB 30 comprises a connector strip 32 for each slide-in module compartment, into which connector strip 32 the respective socket strip 24 of the slide-in modules 4 can snap. The backplane PCB provides communication by way of a network in the form of an Ethernet connection and other optional signal lines. This means that each connector strip of a slide-in module compartment comprises Ethernet wiring, through which the associated snapped-in slide-in module becomes a participant in a network or a sub-network. To this purpose the corresponding pins on the terminal strip of commonly used 3U-CompactPCI cards are made to connect to the connector strip 32 of the corresponding slide-in module compartment on the rear printed circuit board of the avionics equipment carrier system by way of the respective adapter printed circuit board 18. To provide a CompactPCI card with the required operating voltages, further pins of the terminal strip are connected to the power supply devices 8 by way of the respective adapter printed circuit board 18 and the connector strip 32 of the backplane PCB or board.

Operation of a CompactPCI printed circuit board requires no further inputs or outputs; however, as an option, further signal lines may be added, which, for example, make it possible to monitor the system status. However, the provision of a PCI bus of its own within the avionics equipment carrier system 2 is not required for integrating CompactPCI cards. As far as the ability to be able to exchange any components during ongoing operation is concerned, furthermore, an Ethernet connection is preferred. For unambiguous identification of a slide-in module located in any desired compartment, electronic and mechanical means are available so that receiving a known and provided-for network address for each device can be assured.

Furthermore, for the purpose of controlling the network connections, for example limitations of data traffic or the setting up of subnets, corresponding devices are inserted into slide-in module compartments, which then carry out administrative tasks. FIG. 5 shows a backplane switch which communicates with all the connector strips 32 of the backplane PCB. By means of a network distributor that can be installed in the rack 10, the data traffic between the slide-in modules 4 can be controlled by way of the backplane switch. This makes it possible to separate communications from each other beyond device groups. For example, devices for monitoring galley functions in an aircraft can be excluded from communicating with an in-flight entertainment system although the devices are connected to the same backplane PCB. However, if required, subnet-independent data transmission can be permitted by way of an additional network administration device.

The hard discs 6 (see FIG. 1) accommodated in the rack 11 are connected, by way of a shared connector strip 34 and an optionally separate backplane PCB, to the devices of the slide-in modules 4 in the rack 10. Preferably, an interface is selected which makes it possible to exchange hard discs during operation, for example in the case of a serial ATA interface (SATA).

By means of a further connector strip 36 that is arranged on the housing 12, the equipped avionics equipment carrier system is further connected to a corresponding counterpart in the avionics rack. There is thus no requirement for disconnecting cables in the case of an exchange.

The areas of application presented above, the listed devices, the arrangement of the devices in the housing 12 of the avionics equipment carrier system, as well as the abovementioned electronics printed circuit board formats and the respective commonly used standards merely refer to exemplary embodiments of the present invention; they are not to be interpreted as limitations to the invention. The scope of protection of the invention is based on the following claims.

Is should also be noted that reference signs in the claims shall not be construed as limiting the scope of the claims.

It should be noted that the term "comprising" does not exclude other elements or steps and the "a" or "an" does not exclude a plurality. Also elements described in association with different embodiments may be combined.

The invention claimed is:

1. An avionics equipment carrier system for slide-in modules, with data-processing, data transmitting, data storing or data displaying devices, comprising:
    a housing,
    at least one module rack for accommodating the slide-in modules,
    at least one backplane PCB with Ethernet connection architecture, and
    an adapter printed circuit board configured for adapting the terminal assignment of the standard electronics printed circuit boards, the adapter printed circuit board having a connector strip configured to be connected to a socket strip of the electronics of the circuit board,
    wherein the dimensions of the housing comply with ARINC 600 standards, and the housing is configured for installation in an avionics module rack as a quick-mount housing, and any desired printed circuit boards of a specific standard format can be used in the slide-in modules, which comprise quick-mount modules, and
    wherein the adapter printed circuit board changes over the connection pins of the standard electronics printed circuit boards that have been selected by a manufacturer and on a socket strip of the adapter printed circuit board provides a terminal assignment that applies to all slide-in modules.

2. The avionics equipment carrier system of claim 1, wherein the slide-in modules that comprise the electronics printed circuit boards are accommodated in a surrounding housing.

3. The avionics equipment carrier system of claim 1, wherein the standard electronics printed circuit boards are Compact-PCI boards.

4. The avionics equipment carrier system of claim 1, wherein the housing comprises a module rack for accommodating hard discs.

5. The avionics equipment carrier system of claim 4, wherein the rack, which is used for accommodating hard discs, is held in the housing so as to reduce vibrations.

6. The avionics equipment carrier system of claim 5, wherein for the purpose of accommodating hard discs the module rack is connected to the slide-in modules by a connector strip located in the module rack, by way of a backplane PCB.

7. The avionics equipment carrier system of claim 1, further comprising a display device for displaying status data of the avionics equipment carrier system.

8. The avionics equipment carrier system of claim 7, wherein the display device comprises operating buttons for controlling the avionics equipment carrier system.

9. The avionics equipment carrier system of claim 1, wherein the avionics equipment carrier system can be cascaded with other avionics equipment carrier systems.

10. The avionics equipment carrier system of claim 1, wherein the slide-in modules can be exchanged during ongoing operation.

11. The avionics equipment carrier system of claim 1, wherein the housing comprises a connector strip connected to a connector socket in the avionics rack with the avionics equipment carrier system inserted.

12. The avionics equipment carrier system of claim 1, wherein the avionics equipment carrier system devices for controlling the data traffic of the Ethernet connection are accommodated in slide-in modules.

* * * * *